United States Patent [19]
Sicignano et al.

[11] Patent Number: 4,929,836
[45] Date of Patent: May 29, 1990

[54] FOCUSING IN INSTRUMENTS, SUCH AS SEMS AND CRTS

[75] Inventors: Albert Sicignano, Mount Kisco; Mehdi Vaez-Iravani, Peekskill, both of N.Y.

[73] Assignee: North American Philips Corporation, New York, N.Y.

[21] Appl. No.: 333,059

[22] Filed: Apr. 3, 1989

Related U.S. Application Data

[63] Continuation-in-part of Ser. No. 151,367, Feb. 2, 1988, Pat. No. 4,845,362.

[51] Int. Cl.⁵ ............................................. H01J 37/21
[52] U.S. Cl. ................................... 250/397; 250/310; 250/307; 358/218
[58] Field of Search .................. 250/310, 307, 396 R, 250/397; 313/442, 443; 358/218

[56] References Cited

U.S. PATENT DOCUMENTS

| | | | |
|---|---|---|---|
| 3,409,799 | 11/1968 | Kurzweil et al. | 358/218 |
| 4,804,840 | 2/1989 | Ichihashi | 250/397 |
| 4,845,362 | 7/1989 | Sicignano et al. | 250/310 |

Primary Examiner—Jack I. Berman
Attorney, Agent, or Firm—Paul R. Miller

[57] ABSTRACT

A significantly improved focusing technique is set forth for use with electron beams, particularly in scanning electron microscopes and/or CRTs. This technique utilizes an in-situ differential signal measurement of an object surface to form a signal which is particularly sensitive to edges in the sample at a superimposed frequency. Perfect focus is obtained when the signal strength at the superimposed frequency is a maximum thereby resulting in a minimum spot size.

4 Claims, 4 Drawing Sheets

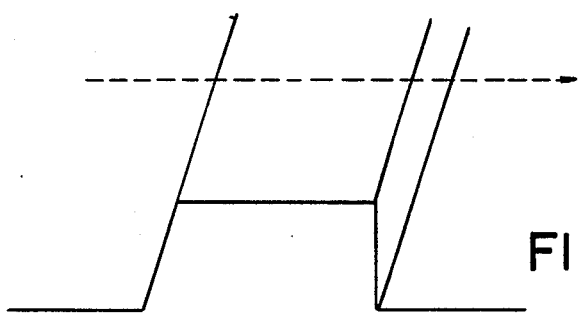
FIG. 5a
FIG. 5b
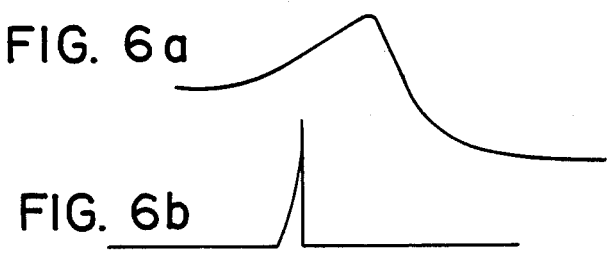
FIG. 6a
FIG. 6b
FIG. 8a
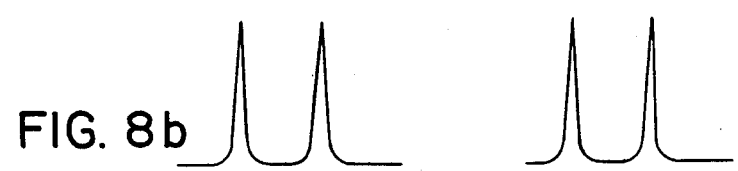
FIG. 8b

FOCUSING IN INSTRUMENTS, SUCH AS SEMS AND CRTS

This application is a continuation-in-part of application Ser. No. 151,367, filed Feb. 2, 1988, now Pat. No. 4,845,362 and the benefits of all common subject matter is hereby claimed for this application.

This invention relates to improvements in SEM focusing utilizing the techniques of in-situ differential scanning electron microscopes (SEM), as well as the ability to increase and enhance focusing of rastering e beam display devices like CRT's.

In-situ differential imaging has been discovered and developed by Applicants for electron beams. Details of such structure and technique are presented in co-pending application Ser. No. 151,367, filed Feb. 2, 1988, now Pat. No. 4,845,362 which application is incorporated in total for further explanation of the in-situ differential scanning technique.

An SEM arrangement according to Pat. No. 4,845,362 has a sample with local projections or variations in the surface which are scanned with an electron beam having a superimposed local deflection where the local deflection is oscillated at a scanning frequency $f_s$. The signal obtained at the frequency $f_s$ is proportional to the differential secondary electron yield. It has further been found that the differential signal obtained at $f_s$ is proportional to the slope of the structure under examination. This enables a precise determination of the locations of steps and local variations in the surface of the sample.

Typically, the deflection signal at frequency $f_s$, being theoretically a square wave signal, but practically a sinusoidal deflection signal, is in the range of 50 kHz to 500 kHz. Its amplitude is adjusted to result in a local electron beam deflection such that the displayed resolution is not degraded. The amplitude is also adjusted for the magnification being used and the probability of encountering sample variations between pixels.

Focusing in the SEM is normally achieved "interactively", that is by the operator using ever increasing magnification steps while imaging a given feature. Focusing techniques used in the prior art may be seen by reference to the book by Reimer, *Scanning Electron Microscopy, Physics of Image Formation and Microanalysis*, Springer-Verlag, Berlin, Heidelberg, New York, Tokyo, 1985, cf. pages 44–56.

Normal focus, as obtained in the prior art, means that in order to emphasize features of the surface beam examined in a SEM, a higher step magnification is required than that for the actual examined image. That is, in order to obtain a normal focus for a 20 Kx image, the magnification of an SEM is increased to obtain a 40 Kx image. At this greater magnification, edges are more easily seen and video signals of the feature edges are maximized. Focusing of a feature at this higher magnification is then maintained upon reducing to a lower magnification. This type of focusing is particularly emphasized for difficult focusing arrangements, such as those in which the edges of features are not sharply defined, or where the features are very small.

In general, the previous techniques, especially as performed by an experienced operator, are usually successful, but it is a subjective process which depends on the skill of the operator and consumes much time.

The present invention sets forth a technique for image focusing that substantially reduces the problems occurring in ordinary SEM focusing, as well as provides improved image sharpness in CRTs.

This focusing technique of the present invention is based on reducing the spot size of an electron beam at the surface of an object, such as an SEM sample or a CRT screen, and making the spot size uniformly small in all directions of the plane of the object.

This technique relies on the steps of directing an electron beam to a focus at an edge of a object structure, generating a spatial differential video signal at a superimposed frequency to optimize the focus, and determining a minimum spot size of the electron beam.

Accordingly, a "perfect focus" in an SEM is defined as the condition for which the differential signal obtained in an in-situ differential imaging technique is a maximum. Because the differential signal is extremely sensitive to feature edges, the perfect focus can be obtained at low magnifications and the necessity to resort to high magnifications to search for a focus, as in the prior art, is obviated.

The presently claimed invention results in a significant reduction in the time expended to achieve good focusing.

Further, this procedure can be adapted to automatic focusing such as electronic monitoring of the differential signal at the deflection frequency and automatic adjusting of the DC focus current. The automatic focusing procedure can be performed at low magnifications resulting in a focus which remains perfect even upon increasing the magnification to a higher magnification imaging.

A range of different in-situ differential imaging modalities can be used by the present invention. Namely, X or Y differential imaging is used where one direction is imaged for line scans. This is useful for not only for an SEM, but also in CRT imaging. Further, X+Y differential imaging having a 90° phase shift to obtain a circular two-dimensional image can be utilized. Also, modulation of the spot size can be utilized. Finally, modulation of the sample in the Z direction where X and Y are in the plane of the sample can be utilized. These last three techniques are useful for two-dimensional imaging.

All of the features and advantages of the present invention may be seen from the following detailed description presented in connection with the drawing figures, not drawn to scale, in which.

Figure 4A:
Figure 4B:
Figure 4C:
Figure 7:
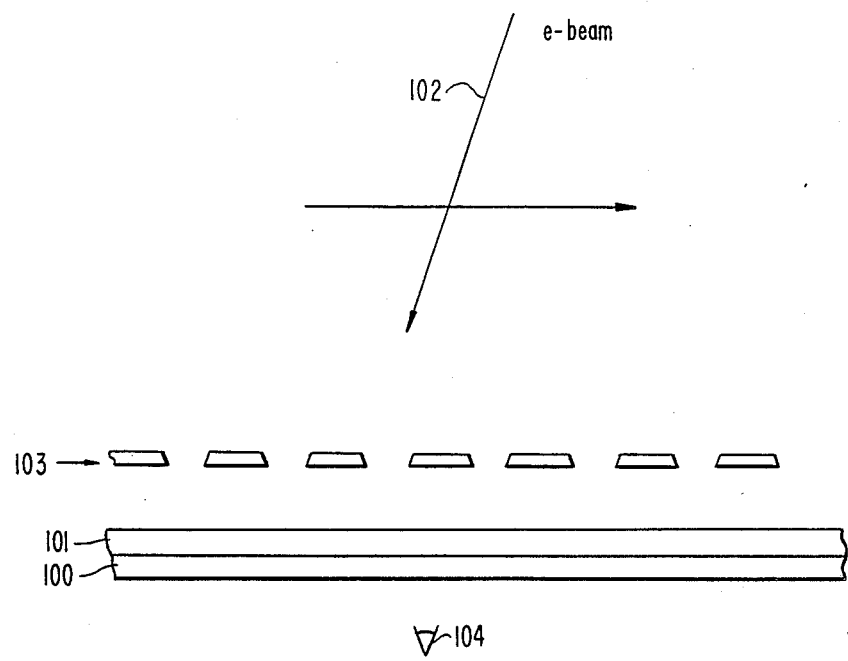

FIG. 4a, FIG. 4b, and FIG. 4c are examples of focusing spots obtained;

FIGS. 5a and 5b are examples of IC scanning with an electron beam to determine features of the IC;

FIG. 6a is an analog or conventional determination of an edge in FIGS. 5a and 5b, while FIG. 6b is a differential determination of the edge according to the present invention;

FIG. 7 is an illustration of an electron beam scan in a CRT arrangement according to the invention; and FIGS. 8a and 8b are respective intensity variations in a CRT arrangement for normal focussing and focussing according to the invention.

Figure 1:
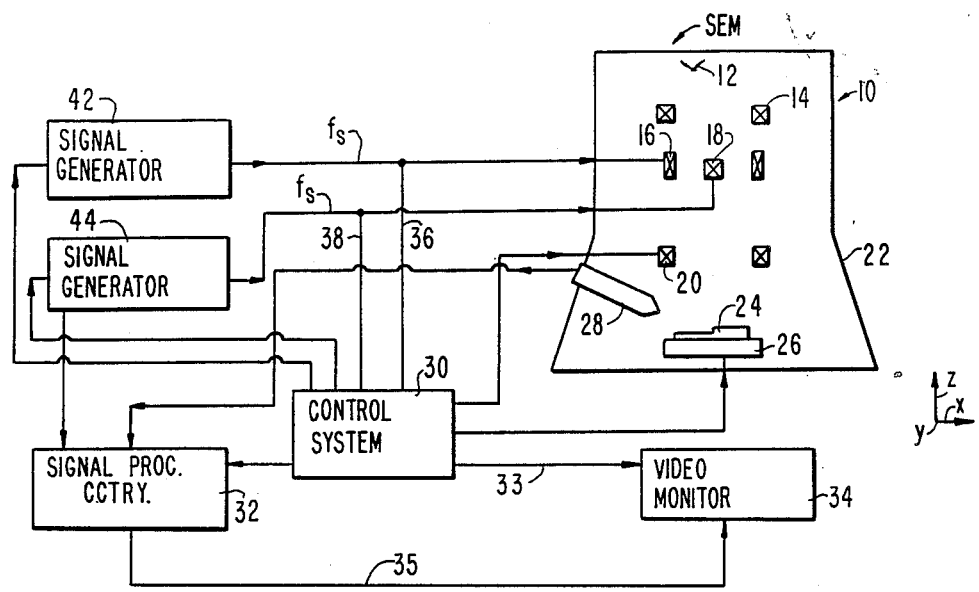
FIG. 1 is a simplified schematic illustration of an example for carrying out the present invention.

A method of obtaining in-situ differential signals in an SEM is schematically shown in FIG. 1 for the SEM apparatus 10. This apparatus 10 includes a conventional electron source 12 providing an electron beam, a standard electro magnetic condensing lens 14, a X-direction deflection assembly 16, a Y-direction deflection assembly 18, and an electromagnetic imaging lens 20. All of these components are shown disposed in an evacuated envelope 22.

The electron beam of the apparatus 10 shown in FIG. 1 is designed to be scanned in the depicted X and Y directions over the surface of an object 24 that is supported on a table 26. By way of a specific illustrative example, the object 24 is assumed to be a semiconductor wafer. Selected portions of the wafer surface are to be successively examined for geometric or material variations.

It is known that various standard detection modalities may be utilized in an SEM. Thus, for example, secondary-electron production or back scattered electrons or other known phenomena arising from impingement of an electron beam on an object may be employed as the basis for monitoring the interaction between the beam and the object 24. Herein for illustrative purposes, it will be assumed that secondary electron production from the object is to be detected. For that purpose, the apparatus 10 includes a secondary-electron detector 28. In turn, the output of the detector 28 is applied to signal processing circuitry 32.

Control system 30 shown in FIG. 1 is designed to supply appropriate timing and scanning signals by the bus 33 to a standard video monitor 34. The actual signals to be displayed on the monitor 34 are supplied thereto by the circuitry 32 through the lead 35. These signals are representative of geometric and material variations on the scanned object 24.

The control signal 30 also supplies standard small X- and/or Y-direction scanning signals to the deflection assemblies 16 and 18 of the SEM apparatus 10. These standard scanning signals are supplied thereto by leads 36 and 38, respectively. These signals can be designed to implement either analog or digital scanning across the surface of the object 24.

In accordance with the present invention, additional signals are superimposed on the standard X- and/or Y-direction scanning signals supplied to the deflection assemblies 16 and 18 by the control system 30. These additional signals are supplied at a frequency $f_s$ by signal generators 42 and 44. The generator 42 supplies signals to the x-direction deflection assembly 16. These signals are, for example, superimposed on the standard x-direction scanning signals supplied by the system 30 to the assembly 16. Similarly, the generator 44 supplies signals to the y direction deflection assembly 18. These signals are superimposed on the standard y direction scanning signals supplied by the system 30 to the assembly 18.

Alternatively, signals supplied by the generator 42 can be supplied to the x-direction deflection assembly 16 while standard y-deflection scanning signals are supplied by the control system 30 to the y-direction deflection assembly 18. Similarly, signals supplied by the generator 44 can be supplied to the y-direction deflection assembly 18 while standard x-direction scanning signals are supplied by the system 30 to the x-direction deflection assembly 16. These alternative combinations of superimposed signals are, for example, particularly advantageous to alignment purposes. The superimposed signal at the frequency $f_s$ constitutes a periodic signal. A square wave would be ideal. In practice, a sinewave is advantageously employed. The amplitude of the superimposed signal is chosen such that local movement or oscillation of the electron beam on the surface on the object is less than the corresponding resolution spot diameter displayed on the monitor 34. In other words, the maximum local displacement or the deflection amplitude of the electron beam due to the superimposed signal is selected to be within a video pixel diameter. In this way, the local beam excursions at $f_s$ do not alter the resolution of the displayed image.

The instantaneous AC signal derived from the aforementioned superimposed signal is directly related to the spatial derivative of the geometric or material properties at the locality under examination on the surface of the object 24. This is so if the size of the locality equals or is less than the corresponding size of displayed video pixel. Moreover, the signal so obtained is a measure of the true spatial derivative of the object if the deflection frequency $f_s$ is chosen such that any locality corresponding to a pixel is interrogated at least twice by the electron beam. If this condition obtains, operation in the in-situ differential mode is then independent of the frequency of the occurrence of object features. In practice, any higher frequency within the detection and signal processing capabilities of the overall system may be utilized.

Figure 2:
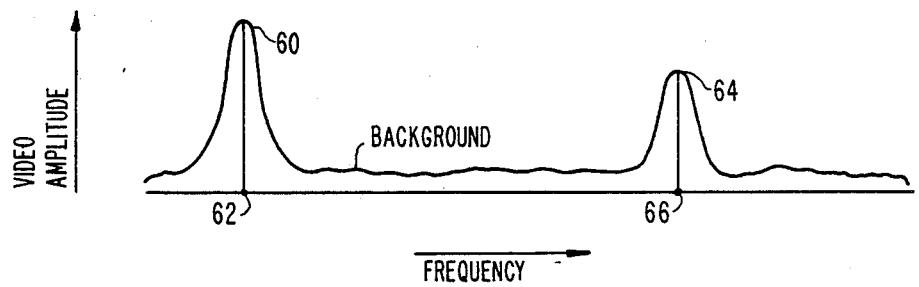
FIG. 2 illustrates the output signals generated in accordance with the arrangement of FIG. 1.

FIG. 2 shows the spectrum of the output signal obtained from the SEM apparatus 10 as a result of scanning a geometric or material variation on the surface of the object 24. Envelope 60 centered about direct current (DC) point 62 represents the conventional output usually obtained from such a scan. Envelope 64 centered about point 66 represents the output attributable to the superimposed signal at the frequency $f_s$. The point 66 corresponds to the frequency $f_s$.

Only the signal envelope 64 is utilized for display purposes on the monitor in accordance with the in situ differential signal. The conventional signal envelope 60 around DC point 62 is in effect discarded. By doing so, many undesirable low-frequency phenomena such as mechanical vibrations and electron-source variations are eliminated from the displayed output or at least substantially reduced. Also, by removing DC-type affects from the output, the entire dynamic range of the video monitor can be devoted to displaying only differential changes Further in some cases, the overall signal-to-noise (S/N) ratio of the signal can be improved by slowing the main or standard scan while still obtaining a good differential signal at the frequency $f_s$.

Figure 3:
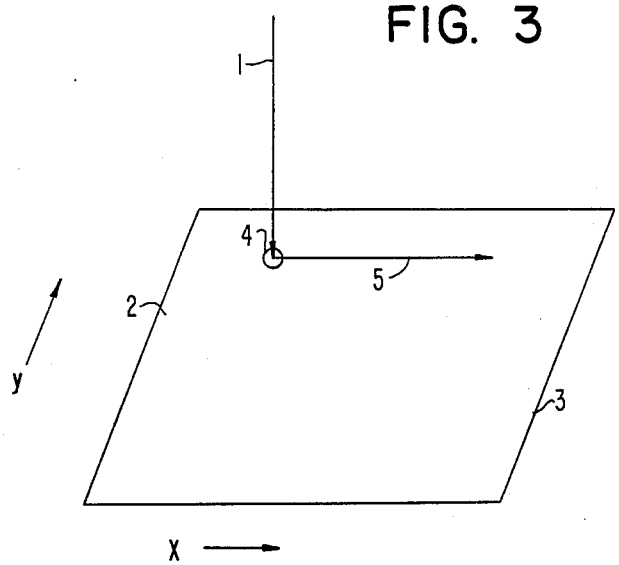
FIG. 3 is an illustrated example of one type of focusing according to the present invention.

FIGS. 3 and 4 illustrate the obtaining of a focus in accordance with the present invention. An electron beam 1 can be scanned in one embodiment across the surface 2 of an object or sample 3. The scan may be in the x-direction of a x-y plane. The electron beam is focused at an area 4. This area 4 may be seen in FIG. 4a as encompassing a given spot size, where the smaller the spot size the better the focus. The spot size is decreased to a "perfect focus" as may be seen in FIG. 4b. In the conventional prior art technique of obtaining the focus, a higher magnification is used to obtain a focus for use at a lower magnification. In accordance with the presently claimed invention, however, the perfect focus is found in the condition when the in-situ differential signal is a maximum. This occurs by spatial differentiating feature edges, for example, in a sample.

Control of stigmatic conditions can also be accomplished. As shown in FIG. 4C the spot size is oblong in one direction. This can be controlled by the magnetic field of the SEM to bring the spot size to a circle, thus being at the perfect focus.

The sensitivity of this in-situ differential signal to edges may be seen from FIGS. 5a and 5b, taken with FIG. 6a and 6b. Namely, in FIG. 5a, the electron beam is scanned across an aluminum stripe 6, for example, in the direction 5.

This gives rise to the differential signal level shown in FIG. 5b. The conventional focusing of the electron beam 1 at the edge 7 of the aluminum stripe, for example, gives rise to the display seen in FIG. 6a. This conventional display means that a substantially higher magnification must be utilized to determine the point 8 at which the edge of the aluminum stripe 6 occurs.

On the other hand, by using the technique of the present invention, the spatial differential of the feature identifies the edge 8 by a peak signal. When this peak is maximized, the condition for perfect focus exists. By this means, the prior art technique of raising the magnification to a higher magnification to determine the correct focus at a lower magnification is unnecessary. No increase in magnification is necessary. A perfect focus is then obtained when the differential signal is a maximum and can be achieved by adjusting the focus controls on the SEM, such as the controls for spot size and stigmation adjustments, until a best focus of minimum spot size is obtained.

This technique can be advantageously applied to the procedure of automatic focusing. Therein, electronic monitoring of the differential signal at the deflection frequency $f_s$ will occur so that the DC focus current and stigmation control are automatically adjusted. The automatic focusing procedure can be performed at low magnifications to form a focus that will remain perfect even at higher magnifications.

These various characteristics for focusing can be applied to other electron beam scanning devices, such as in CRTs. The scanning of the electron beam across the screen is the analog to scanning an electron beam across a sample in an SEM. In electron beam scanning devices, such as a CRT, optimization of the spot focus travelling across the CRT screen can be achieved since the sharpness of the scanned line is a function of the spot size of the scanning electron beam.

It has been found that the intensity of the detected differential signal is a maximum when the spot size is a minimum for a given current. Accordingly, a minimum spot size is achieved by maximizing the differential signal when passing through openings of a shadow mask.

In FIG. 7, the e beam 102 is scanned across the phosphor layer 101 provided on a glass screen 100 of a CRT. An observer 104, or light or spot detector, uses the video screen for a produced image. In the arrangement of FIG. 7, a shadow mask 103 is provided over the phosphor 101 to form openings for the e-beam 102. The shape of the shadow mask edges are formed to enhance color portions of a display.

As seen in FIG. 8a, the focus of the e-beam through the openings of grid 103 under normal conditions has a brightness or intensity spread which extends approximately over the extent of the opening. The spot size according to the present invention is minimized relative to intensity, as shown in FIG. 8b. This occurs by the spatial differentiation of the shadow mask opening. By this technique, brightness intensity of the electron beam can be significantly increased for the display. The time constant or persistence of phosphors used in CRT's can be provided to be consistent with the scanning speed or frequency of the superimposed signal $f_s$

What is claimed:

1. A method of image focusing comprising the steps of
   directing an electron beam to a focus at an edge of an object surface,
   generating a spatial differential signal by superimposing an oscillating local deflection field on said electron beam to optimize said focus at a variation of said object surface, and
   determining a minimum spot size of said electron beam.

2. A method according to claim 1, wherein said object surface is a sample in a scanning electron microscope, and wherein said minimum spot size is determined at local steps of a surface of said sample.

3. A method according to claim 1, wherein said object surface is an internal surface of a CRT, and wherein said minimum spot size is determined at local variations of said internal surface.

4. A method according to claim 3, wherein said internal surface is a shadow mask having openings, and wherein said local variations are edges of said openings.

* * * * *